US008940565B1

(12) United States Patent
Park et al.

(10) Patent No.: US 8,940,565 B1
(45) Date of Patent: Jan. 27, 2015

(54) METHODS OF MANUFACTURING THIN-FILM TRANSISTOR ARRAY SUBSTRATE AND LIQUID CRYSTAL DISPLAY

(71) Applicant: Samsung Display Co. Ltd., Yongin (KR)

(72) Inventors: Ji Young Park, Hwaseong-si (KR); Gwan Ha Kim, Hwaseong-si (KR); Dong Il Kim, Suwon-si (KR); Sang Gab Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/194,015

(22) Filed: Feb. 28, 2014

(30) Foreign Application Priority Data

Aug. 9, 2013 (KR) .......................... 10-2013-0094890

(51) Int. Cl.
*H01L 21/00* (2006.01)
*H01L 27/12* (2006.01)

(52) U.S. Cl.
CPC .................................. *H01L 27/1262* (2013.01)
USPC ........................................... 438/30; 438/149

(58) Field of Classification Search
CPC ............ H01L 27/3246; H01L 27/3251; H01L 27/3258; H01L 2227/32; H01L 2227/326
USPC .................. 438/30, 149–167; 257/59, 60
See application file for complete search history.

(56) References Cited

U.S. PATENT DOCUMENTS

2010/0151610 A1* 6/2010 Choung et al. ................... 438/34
2010/0167206 A1* 7/2010 Jeon et al. ................... 430/281.1

FOREIGN PATENT DOCUMENTS

| JP | 2009-036947 | 2/2009 |
| KR | 10-2006-0001165 | 1/2006 |
| KR | 10-2007-0080476 | 8/2007 |
| KR | 10-2011-0048333 | 5/2011 |
| KR | 10-2011-0071313 | 6/2011 |
| KR | 10-2012-0115837 | 10/2012 |
| KR | 10-2013-0011856 | 1/2013 |

* cited by examiner

*Primary Examiner* — Brook Kebede
(74) *Attorney, Agent, or Firm* — Cantor Colburn LLP

(57) ABSTRACT

A method of manufacturing a thin film transistor array substrate includes providing a plurality of gate lines and a plurality of data lines on a first substrate, providing an organic layer on the gate lines and the data lines, providing a first electrode on the organic layer, providing a passivation layer on the first electrode, providing a second electrode on the passivation layer, providing a first cover layer on the second electrode to cover the second electrode, providing a plurality of photosensitive layer patterns on the first cover layer, providing a plurality of first cutout patterns in the first cover layer and a plurality of second cutout patterns in the second electrode using the photosensitive layer patterns as an etch mask, and providing a plurality of third cutout patterns in the passivation layer using the first cover layer as an etch mask.

20 Claims, 27 Drawing Sheets

METHODS OF MANUFACTURING THIN-FILM TRANSISTOR ARRAY SUBSTRATE AND LIQUID CRYSTAL DISPLAY

This application claims priority to Korean Patent Application No. 10-2013-0094890 filed on Aug. 9, 2013, and all the benefits accruing therefrom under 35 U.S.C. §119, the content of which in its entirety is herein incorporated by reference.

BACKGROUND

1. Field

Exemplary embodiments of the invention relate to a method of a thin-film transistor ("TFT") array substrate and a liquid crystal display ("LCD"), and more particularly, to a method of manufacturing a TFT array substrate and an LCD, in which a first electrode and a second electrode are disposed on an insulating substrate.

2. Description of the Related Art

A liquid crystal display ("LCD") is one of the most widely used types of flat panel displays. In such an LCD, voltages are applied to electrodes to rearrange liquid crystal molecules of a liquid crystal layer, thereby adjusting the amount of light that transmits through the liquid crystal layer.

LCDs may be effectively configured to have a thin thickness, but may have low lateral visibility compared to front visibility thereof. In an LCD, various liquid crystal arrangements and driving methods are used to increase the lateral visibility thereof. In an LCD, electric field generating electrodes (i.e., a common electrode and a pixel electrode) are all provided on one substrate in the LCDs to realize wide viewing angles.

In such an LCD, at least one of two electric field generating electrodes (i.e., a pixel electrode and a common electrode) may have a plurality of cutouts and a plurality of branch electrodes defined by the cutouts.

To form two electric field generating electrodes on one thin-film transistor ("TFT") array substrate as described above, a plurality of optical masks may be used.

In an LCD, where the common electrode to which a voltage of a certain magnitude is applied is integrally formed as a single unitary and indivisible unit, a signal transmitted to the common electrode may be delayed.

SUMMARY

Exemplary embodiments of the invention provide a method of manufacturing a thin-film transistor ("TFT") array substrate, in which two electric field generating electrodes are provided on the TFT array substrate without increasing manufacturing costs.

Exemplary embodiments of the invention also provide a method of manufacturing an LCD, in which a passivation layer disposed under an electrode may be effectively prevented from being over-etched and thus causing a portion of the electrode to protrude further than the passivation layer.

However, exemplary embodiments of the invention are not limited to the embodiments described herein. The above and other features of the invention will become more apparent to one of ordinary skill in the art to which the invention pertains by referencing the detailed description of the invention given below.

According to an exemplary embodiment of the invention, the method of manufacturing a TFT array substrate includes providing a plurality of gate lines and a plurality of data lines on a first substrate, providing an organic layer on the gate lines and the data lines, providing a first electrode on the organic layer, providing a passivation layer on the first electrode, providing a second electrode on the passivation layer, providing a first cover layer on the second electrode to cover the second electrode, providing a plurality of photosensitive layer patterns on the first cover layer, providing a plurality of first cutout patterns in the first cover layer and a plurality of second cutout patterns in the second electrode using the photosensitive layer patterns as an etch mask, and providing a plurality of third cutout patterns in the passivation layer using the first cover layer as an etch mask.

According to another exemplary embodiment of the invention, the method of manufacturing a liquid crystal display ("LCD") includes providing a plurality of gate lines and a plurality of data lines on a first substrate, providing an organic layer on the gate lines and the data lines, providing a first electrode on the organic layer to cover at least part of the organic layer, providing a passivation layer on the first electrode, providing a second electrode on the passivation layer, providing a cover layer on the second electrode to cover the second electrode, providing photosensitive layer patterns on the cover layer, providing first cutout patterns in the cover layer and second cutout patterns in the second electrode by etching the cover layer and the second electrode using the photosensitive layer patterns as an etch mask, removing the photosensitive layer patterns, removing the cover layer, and providing a second substrate to face the first substrate.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
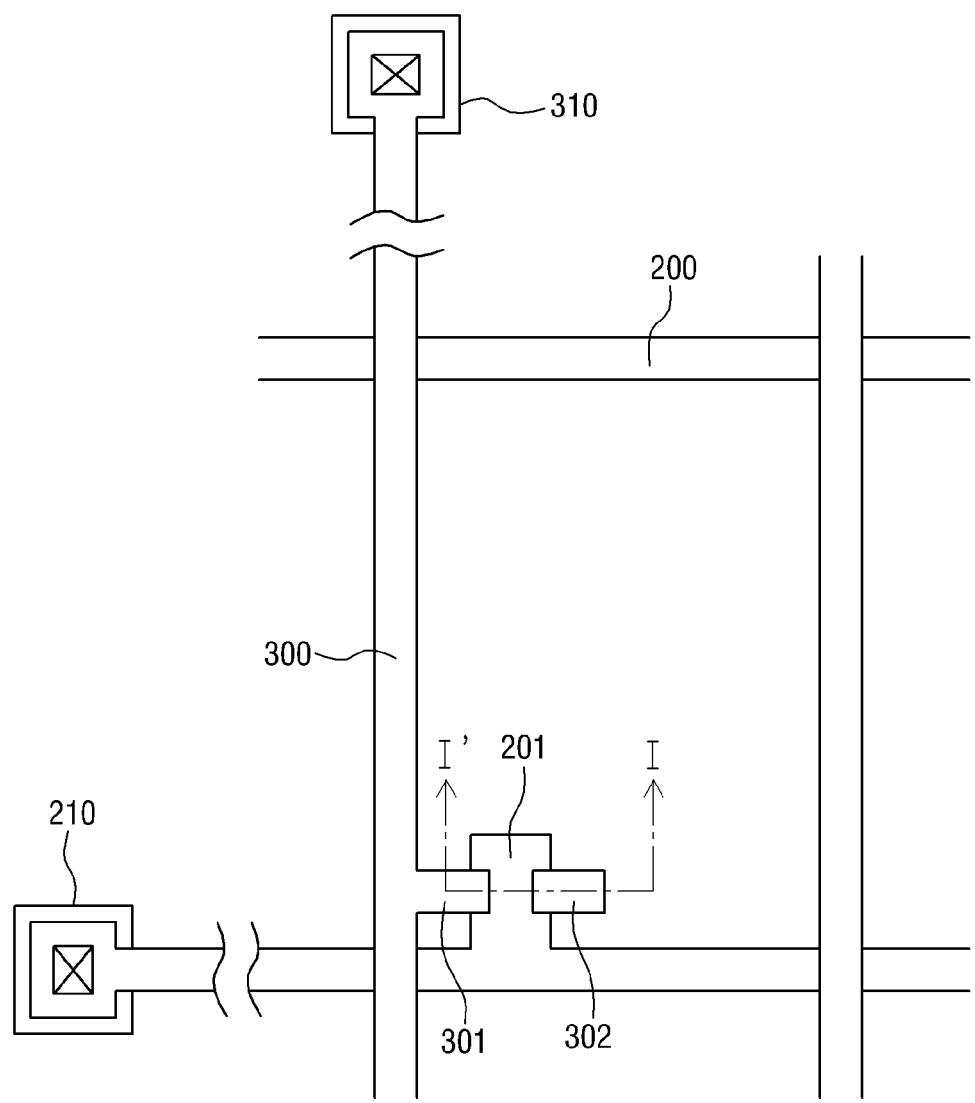
FIG. 1 is a partial plan view of a thin-film transistor ("TFT") array substrate manufactured by an exemplary embodiment of a method of manufacturing a TFT array substrate, according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the accompanying drawings.

FIG. 1 is a partial plan view of a thin-film transistor (TFT) array substrate manufactured by an exemplary embodiment of a method of manufacturing a TFT array substrate according to the invention.

Figure 2:
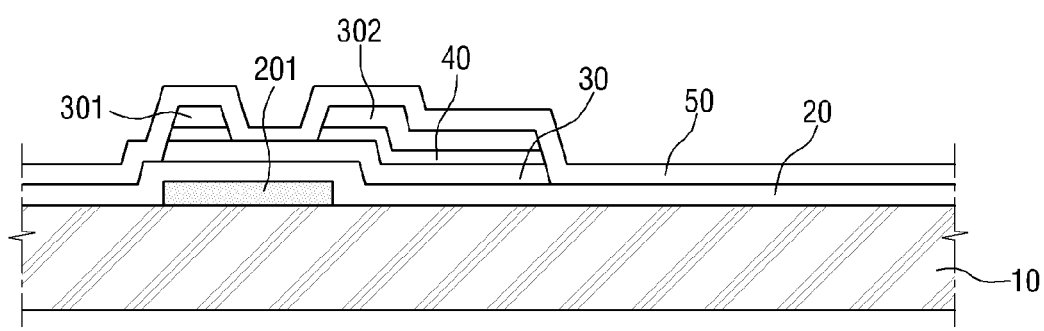
FIG. 2 is a cross-sectional view taken along line I-I' of FIG. 1.
Figure 3:
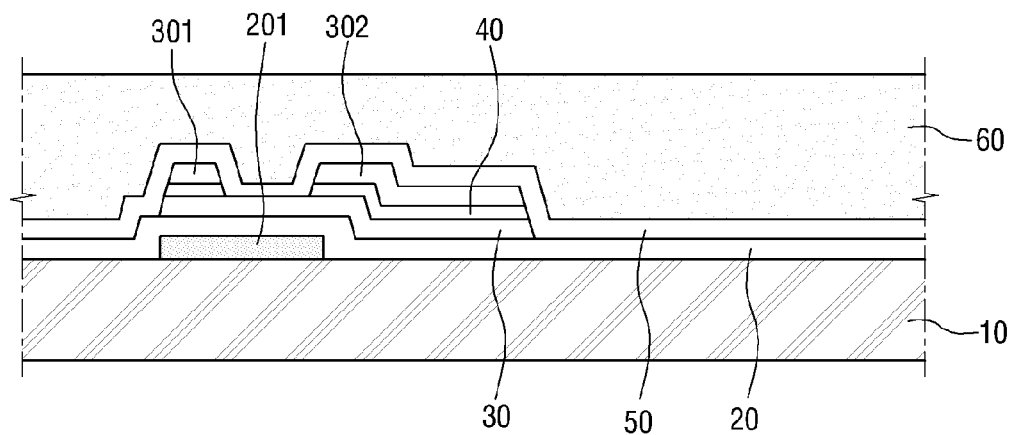
FIGS. 3 through 17 are cross-sectional views illustrating an exemplary embodiment of the method of manufacturing a TFT array substrate, according to the invention.

FIG. 2 is a cross-sectional view taken along line I-I' of FIG. 1.

FIGS. 3 through 17 are cross-sectional views illustrating an exemplary embodiment of the method of manufacturing a TFT array substrate, according to the invention.

Referring to FIGS. 1 through 17, an exemplary embodiment of the method of manufacturing a TFT array substrate includes providing, e.g., forming, a plurality of gate lines 200 and a plurality of data lines 300 on a first substrate 10, providing an organic layer 60 on the gate lines 200 and the data lines 300, providing a first electrode 70 on the organic layer 60, providing a passivation layer 90 on the first electrode 70, providing a second electrode 100 on the passivation layer 90, providing a first cover layer 110 on the second electrode 100 to cover the second electrode 100, providing a plurality of photosensitive layer patterns 82 on the first cover layer 110, providing a plurality of first cutout patterns 111 in the first cover layer 110 and a plurality of second cutout patterns 101 in the second electrode 100 using the photosensitive layer patterns 82 as an etch mask, and providing a plurality of third cutout patterns 91 in the passivation layer 90 using the first cover layer 110 as an etch mask.

In such an embodiment, as described above, the gate lines 200 and the data lines 300 are provided, e.g., formed, on the first substrate 10. The providing of the gate lines 200 and the data lines 30 on the first substrate 10 will now be described in greater detail with reference to FIGS. 1 and 2.

The first substrate 10 may be an insulating substrate including glass or plastic. The gate lines 200 may be provided on the first substrate 10.

Each of the gate lines 200 may include a gate electrode 201 and a gate pad 210 for electrical connection with another layer or an external driver circuit. In one exemplary embodiment, for example, each of the gate lines 200 may include an aluminum (Al)-based metal, such as aluminum or an aluminum alloy, a silver (Ag)-based metal, such as silver or a silver alloy, a copper (Cu)-based metal such as copper or a copper alloy, a molybdenum (Mo)-based metal, such as molybdenum or a molybdenum alloy, chrome (Cr), tantalum (Ta), titanium (Ti), or a combination thereof. However, the material of each of the gate lines 200 is not limited to the above materials, and a transparent or semi-transparent material having conductivity may be used to form each of the gate lines 200.

Each of the gate lines 200 may have a single layer structure or a multilayer structure including at least two conductive layers having different physical characteristics from each other.

A gate insulating layer 20 may be provided on the gate lines 200. The gate insulating layer 20 may include silicon nitride (SiNx) or silicon oxide (SiOx), for example, but the material that forms the gate insulating layer 20 is not limited to these materials. The gate insulating layer 20 may have a single layer structure or a multilayer structure including at least two conductive layers having different physical characteristics from each other.

A semiconductor layer 30 may be provided on the gate insulating layer 20. The semiconductor layer 30 may include amorphous silicon or polycrystalline silicon, for example. The semiconductor layer 30 may include an oxide semiconductor, for example, but not being limited thereto.

An ohmic contact member 40 may be provided on the semiconductor layer 30. The ohmic contact member 40 may include a material, such as n+ hydrogenated amorphous silicon doped with phosphorous-containing n-type impurities in high concentration, or silicide, for example.

The ohmic contact member 40 may be provided in pairs on the semiconductor layer 30. In an exemplary embodiment, in which the semiconductor layer 30 includes an oxide semiconductor, the ohmic contact member 40 may be selectively omitted.

A data wiring including a source electrode 301, a drain electrode 302 and each of the data lines 300 may be provided on the semiconductor layer 30 and the gate insulating layer 20. Each of the data lines 300 may include a data pad 310 for connection with another layer or an external driver circuit. Each of the data lines 300 may transmit a data signal and may cross the gate lines 200. In one exemplary embodiment, for example, the gate lines 200 may extend substantially along a horizontal direction, and the data lines 300 may extend substantially along a vertical direction to cross the gate lines 200. However, the arrangement of the gate lines 200 and the data lines 300 is not limited to the arrangement described above.

In an exemplary embodiment, as shown in FIG. 1, each of the data lines 300 and the gate lines 200 have a shape of a straight line, but not being limited thereto. In an alternative exemplary embodiment, each of the data lines 300 and each of the gate lines 200 may include a bent portion. Such configuration is well known to those of ordinary skill in the art and detailed description thereof will be omitted.

In an exemplary embodiment, the source electrode 301, which extends from each of the data lines 300, may be coplanar with the each of the data lines 300. The drain electrode 302 may extend substantially parallel to the source electrode 301. In an exemplary embodiment, the drain electrode 302 may be substantially parallel to a portion of each of the data lines 300.

The gate electrode 201, the source electrode 301 and the drain electrode 302 may form, e.g., collectively define, a TFT together with the semiconductor layer 30, and a channel of the TFT may be formed in the semiconductor layer 30 between the source electrode 301 and the drain electrode 302.

Each of the data lines 300 may include a refractory metal such as molybdenum, chrome, tantalum or titanium, or an alloy thereof, for example. Each of the data lines 300 may have a multilayer structure including a refractory metal layer and a low-resistance conductive layer. In one exemplary embodiment, for example, the multilayer structure may include a chrome or molybdenum lower layer and an aluminum upper layer. In one alternative exemplary embodiment, for example, the multilayer structure may include a molybdenum lower layer, an aluminum intermediate layer and a molybdenum upper layer. However, the material that forms each of the data lines 300 is not limited to the above materials, and a transparent or semi-transparent material having conductivity may be used to form each of the data lines 300.

A protective layer 50 may be disposed on the data line 300, the gate insulating layer 20 and an exposed portion of the semiconductor layer 30. The protective layer 50 may include an organic insulating material or an inorganic insulating material.

The organic layer 60 may be provided on the gate lines 200 and the data lines 300. The providing of the organic layer 60 on the gate lines 200 and the data lines 300 will now be described in greater detail with reference to FIG. 3.

The organic layer 60 may be provided on the protective layer 50. The organic layer 60 may be relatively thicker than the protective layer 50. In an exemplary embodiment, the organic layer 60 may be a planarization layer. In such an embodiment, a top surface of the organic layer 60 may be substantially flat.

The organic layer 60 is provided in a display area, in which a plurality of pixels are provided, and may not be provided in a peripheral area, in which the gate pad 210, the data pad 310, etc. are provided. However, the invention is not limited thereto. In an exemplary embodiment, a thickness of the organic layer 60 in the peripheral area may be different from the thickness of the organic layer 60 in the display area, but not being limited thereto. In an alternative exemplary embodiment, the organic layer 60 may be omitted.

The first electrode 70 may be provided on the organic layer 60. The providing of the first electrode 70 will now be described in greater detail with reference to FIGS. 4 through 8.

The providing of the first electrode 70 on the organic layer 60 may include exposing the drain electrode 302, providing the first electrode 70 on the organic layer 60 and an exposed portion of the drain electrode 302, providing a first photosensitive layer pattern 81 on the first electrode 70, and partially etching the first electrode 70 using the first photosensitive layer pattern 81 as an etch mask.

Figure 4:
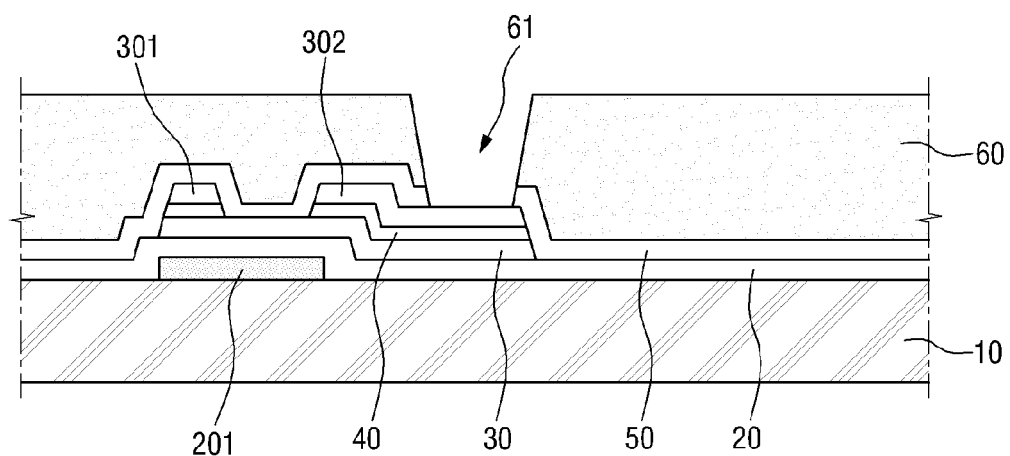

Referring to FIG. 4, a first contact hole 61 may be formed in the organic layer 60 to expose the drain electrode 302. The first contact hole 61 may penetrate through the organic layer 60 and the protective layer 50 to expose at least a portion of the drain electrode 302.

Figure 5:
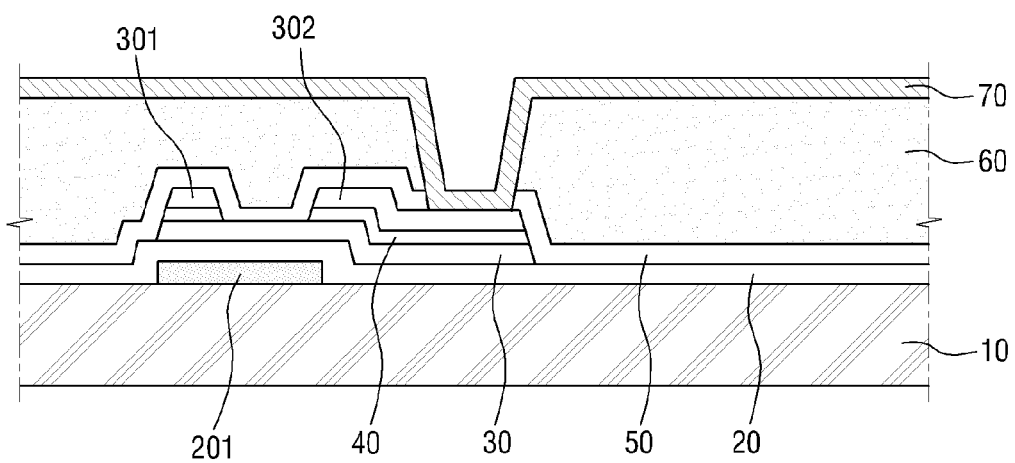

Referring to FIG. 5, the first electrode 70 may be provided on the organic layer 60 and an exposed portion of the drain electrode 302. In an exemplary embodiment, the first electrode 70 may be, but is not limited to, a pixel electrode. In one exemplary embodiment, for example, the first electrode 70 may include indium tin oxide ("ITO") or indium zinc oxide ("IZO"), but the material that forms the first electrode 70 is not limited to the above materials.

In an exemplary embodiment, the first electrode 70 is provided to contact the drain electrode 302 via the first contact hole 61, the first electrode 70 and the drain electrode 302 may be electrically connected to each other, and the first electrode 70 may receive a voltage from the drain electrode 302.

In such an embodiment, the first electrode 70 may be a whole surface electrode that covers substantially an entire of a surface of the first substrate 10. However, the invention is not limited thereto, and the first electrode 70 may be provided on a portion of the first substrate 10 or may be partially provided on the first substrate 10 in an alternative exemplary embodiment.

Figure 6:
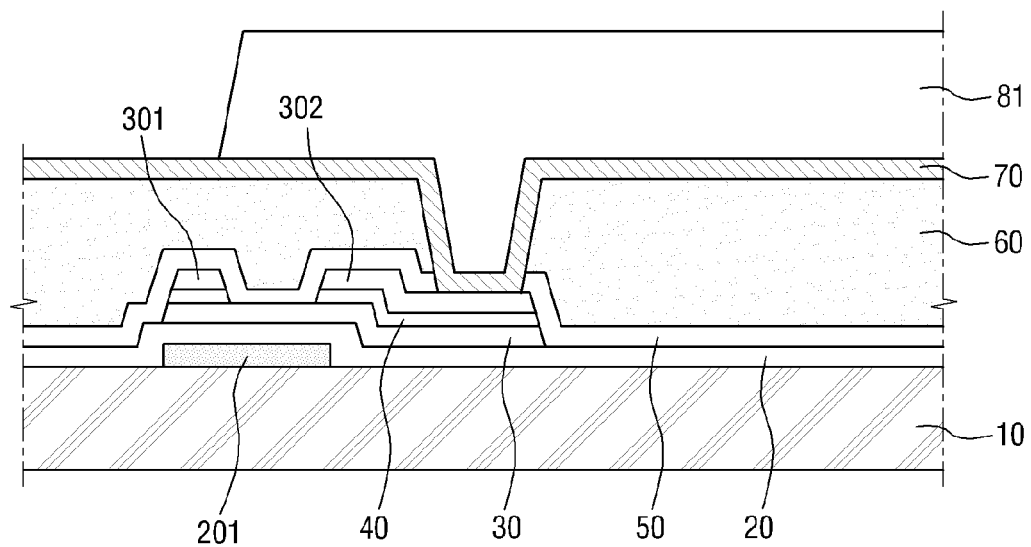

Referring to FIG. 6, the first photosensitive layer pattern 81 may be provided on the first electrode 70. The first photosensitive layer pattern 81 may partially cover the first electrode 70.

Figure 7:
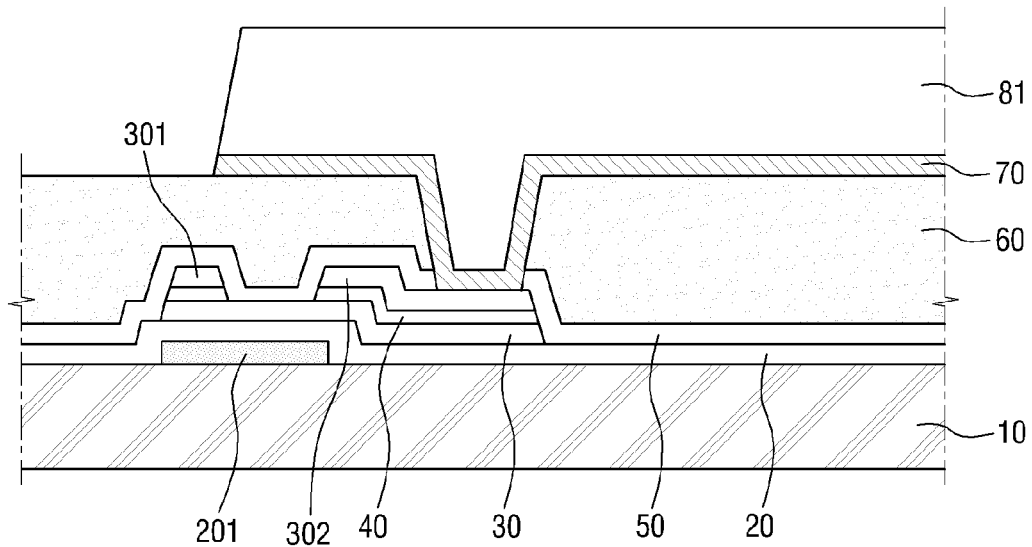

Referring to FIG. 7, the first electrode 70 may be partially etched using the first photosensitive layer pattern 81 as an etch mask. In such an embodiment, the first electrode 70 may be partially etched using the first photosensitive layer pattern 81 as an etch mask and the organic layer 60 as an etch-stop layer.

By partially etching the first electrode 70, a pattern, which corresponds to the shape of the first photosensitive layer pattern 81 disposed on the first electrode 70, is provided in the first electrode 70. In an exemplary embodiment, the first electrode 70 may be patterned into a shape including a plurality of slits, but the shape of the first electrode 70 is not limited to the above shape.

Figure 8:
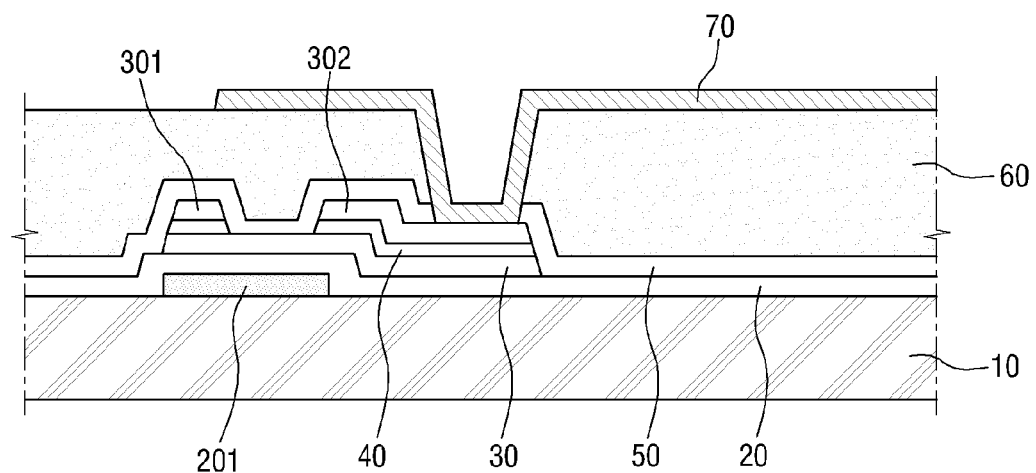
Figure 9:
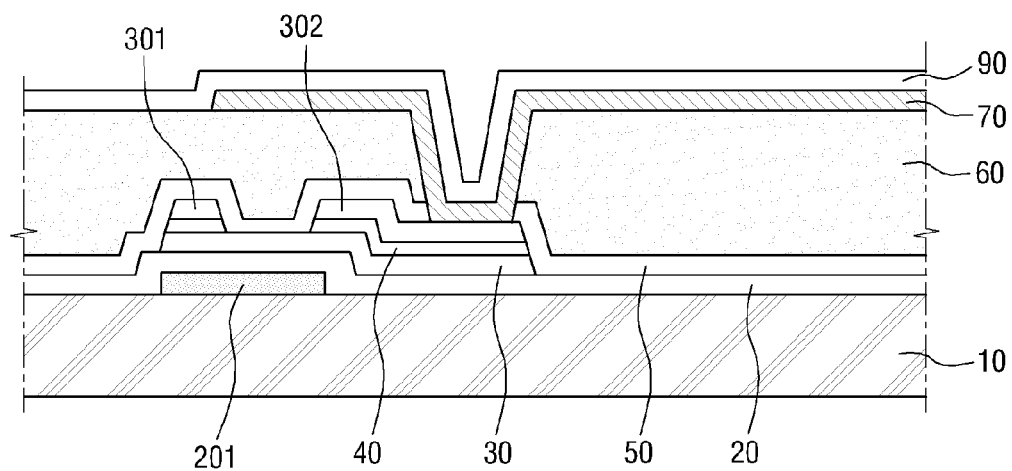
Figure 10:
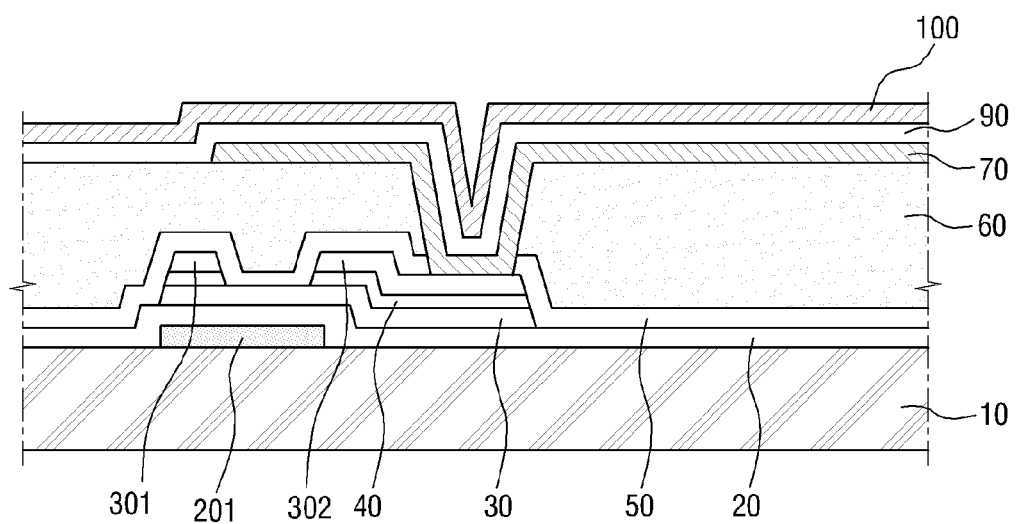
Figure 11:
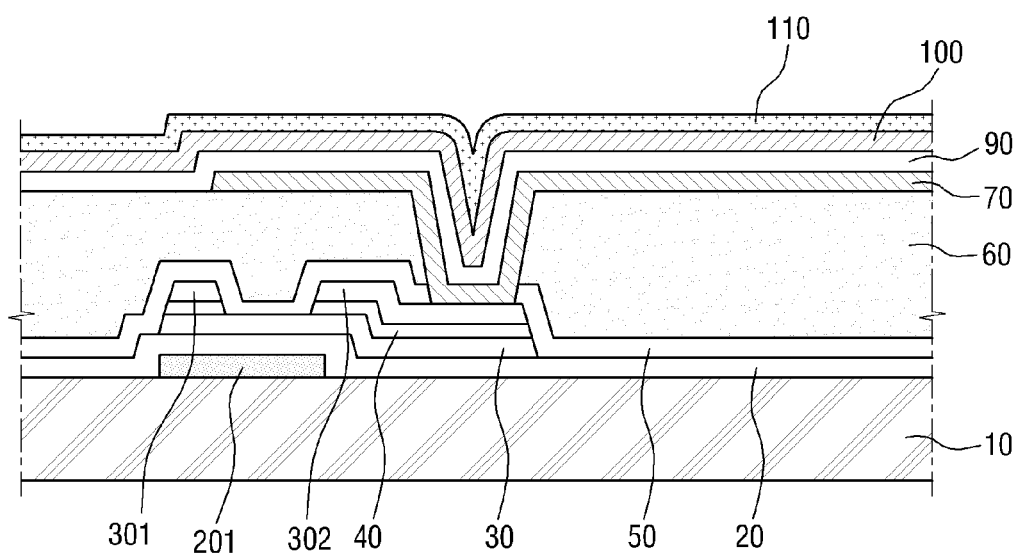
Figure 12:
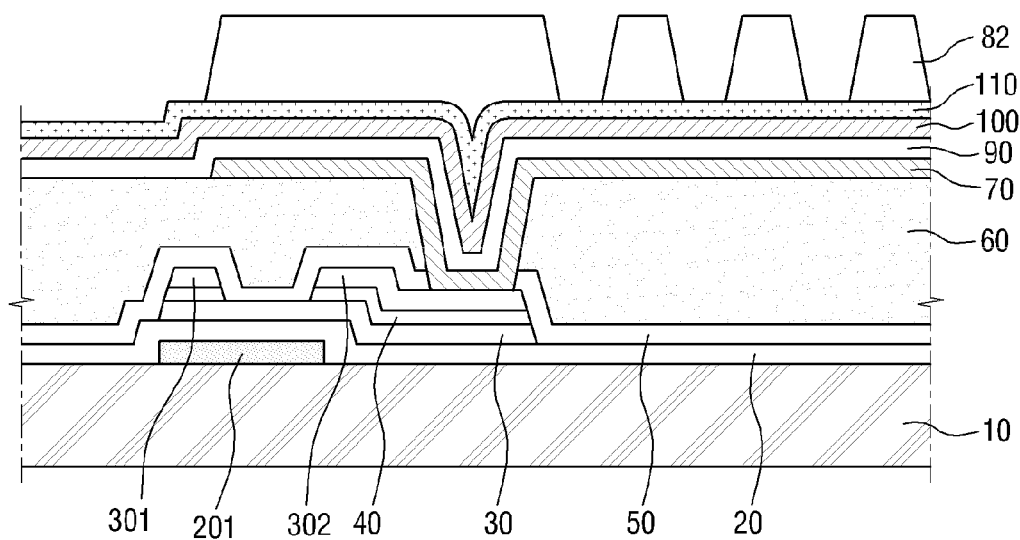

Referring to FIG. 8, after the first electrode 70 is patterned, the first photosensitive layer pattern 81 may be removed. After the removal of the first photosensitive layer pattern 81, only the patterned first electrode 70 may remain on the organic layer 60.

In an exemplary embodiment, as shown in FIGS. 4 through 8, the first electrode 70 is provided on the organic layer 60 using a photosensitive layer pattern. However, the scope of the invention is not limited by the method of providing the first electrode 70 on the organic layer 60.

In such an embodiment, the passivation layer 90 is provided on the first electrode 70. The providing of the passivation layer 90 on the first electrode 70 will now be described in detail with reference to FIG. 9. The passivation layer 90 may be provided on the first electrode 70. The passivation layer 90 may include, but not limited to, an inorganic insulating material, for example. The passivation layer 90 may be provided to cover the first electrode 70 and to thereby protect the first electrode 70.

In such an embodiment, the second electrode 100 is provided on the passivation layer 90. The providing of the second electrode 100 on the passivation layer 90 will now be described in detail with reference to FIG. 10.

The second electrode 100 may be provided on the passivation layer 90. In an exemplary embodiment, the second electrode 100 may be a common electrode. The second electrode 100 may include ITO or IZO, for example, but the material that forms the second electrode 100 is not limited to the above materials.

In such an embodiment, the second electrode 100 may be, but is not limited to, formed as a whole surface electrode that substantially completely covers a surface the passivation layer 90.

In an exemplary embodiment, the first cover layer 110 is provided on the second electrode 100 to cover the second electrode 100. The providing of the first cover layer 110 on the second electrode 100 to cover the second electrode 100 will now be described in detail with reference to FIG. 11. The first cover layer 110 may be provided on the second electrode 100 to cover the second electrode 100. The first cover layer 110 may include a metal. The first cover layer 110 may include an aluminum (Al)-based metal, such as aluminum or an aluminum alloy, a silver (Ag)-based metal, such as silver or a silver alloy, a copper (Cu)-based metal such as copper or a copper alloy, a molybdenum (Mo)-based metal, such as molybdenum or a molybdenum alloy, chrome (Cr), tantalum (Ta), titanium (Ti), or a combination thereof. However, the material that forms the first cover layer 110 is not limited to the above materials. In an exemplary embodiment, the first cover layer 110 may substantially completely cover the second electrode 100. However, the invention is not limited thereto, and the first cover layer 110 may partially cover the second electrode 100 in an alternative exemplary embodiment.

A plurality of second photosensitive layer patterns 82 are provided on the first cover layer 110. The providing of the second photosensitive layer patterns 82 on the first cover layer 110 will now be described in detail with reference to FIG. 12.

The second photosensitive layer patterns 82 may be provided on the first cover layer 110. Providing the second photosensitive layer patterns 82 may be performed by exposing and developing a photosensitive layer using an optical mask, which is well known to those of ordinary skill in the art and detailed description thereof will be omitted.

The second photosensitive layer patterns 82 may be separated or spaced apart from each other by a predetermined distance. The second photosensitive layer patterns 82 may have substantially the same width as each other or different widths from each other. In an alternative exemplary embodiment, the second photosensitive layer patterns 82 may include a combination of photosensitive layer patterns having substantially the same width and photosensitive layer patterns having the different widths.

Figure 13:
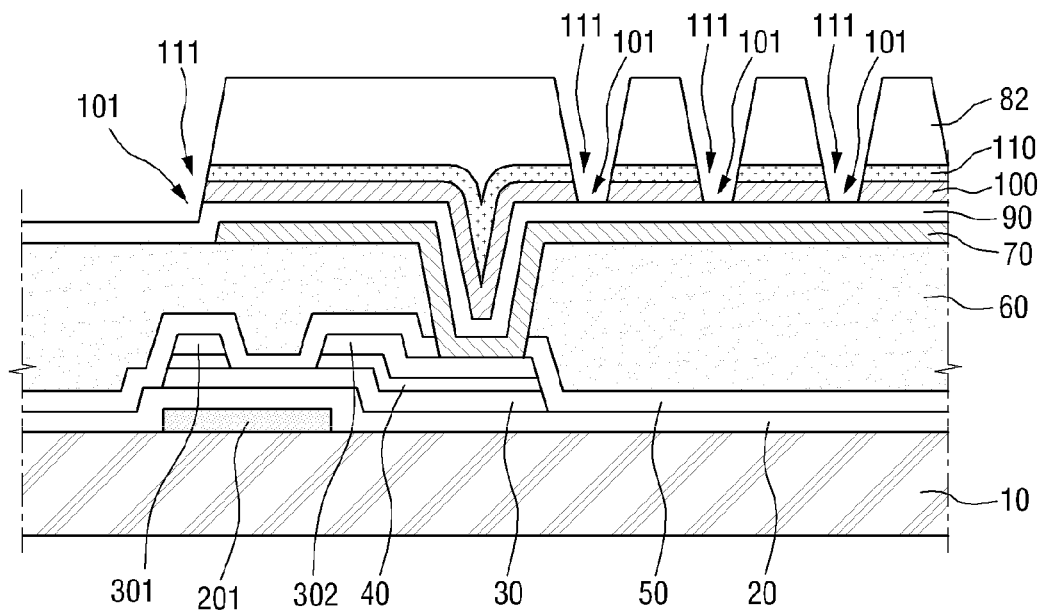

The first cover layer 110 and the second electrode 100 are etched using the second photosensitive layer patterns 82 as an etch mask. The etching of the first cover layer 110 and the second electrode 100 using the second photosensitive layer patterns 82 as an etch mask will now be described in detail with reference to FIG. 13. Referring to FIG. 13, the first cover layer 110 and the second electrode 100 may be at least partially etched using the second photosensitive layer patterns 82 as an etch mask. In such an embodiment, the first cover layer 110 and the second electrode 100 may be at least partially etched using the second photosensitive layer patterns 82 as an etch mask and the passivation layer 90 as an etch-stop layer. In an exemplary embodiment, the first cover layer 110 and the second electrode 100 may be wet-etched. In an exemplary embodiment, the first cover layer 110 and the second electrode 100 may be etched together. In such an embodiment, an etchant including phosphoric acid, nitric acid or acetic acid may be used to etch the first cover layer 110 and the second electrode 100. In such an embodiment, the first cover layer 110 and the second electrode 100 may be etched together using the same etchant, depending on the materials that form the first cover layer 110 and the second electrode 100. In one exemplary embodiment, for example, the first cover layer 110 may include an aluminum-based material and the second electrode 100 may include ITO, a Mo/Al/Mo etchant may be used to etch the first cover layer 110 and the second electrode 100 together. However, the materials of the first cover layer 110 and the second electrode 100 and the type of etchant are not limited thereto. In an alternative exemplary embodiment, and the first cover layer 110 and the second electrode 100 may be etched independently of each other or separately.

The patterns formed in the second electrode 100 and the first cover layer 110 by the partial etching of the first cover layer 110 and the second electrode 100 may correspond to the shape of the second photosensitive layer patterns 82 disposed on the first cover layer 110. In such an embodiment, a plurality of cutout patterns may be provided in the second electrode 100 and the first cover layer 110. For convenience of description, cutout patterns provided in the first cover layer 110 will be referred to as first cutout patterns 111, and cutout patterns provided in the second electrode 100 will be referred to as second cutout patterns 101. The first cutout patterns 111 and the second cutout patterns 101 may at least partially overlap each other.

Figure 14:
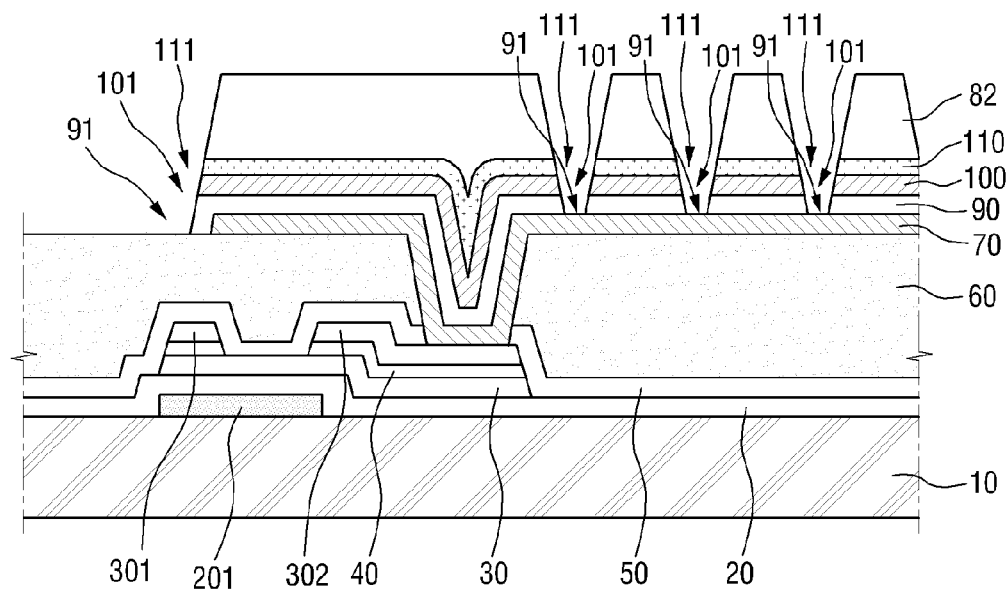
Figure 15:
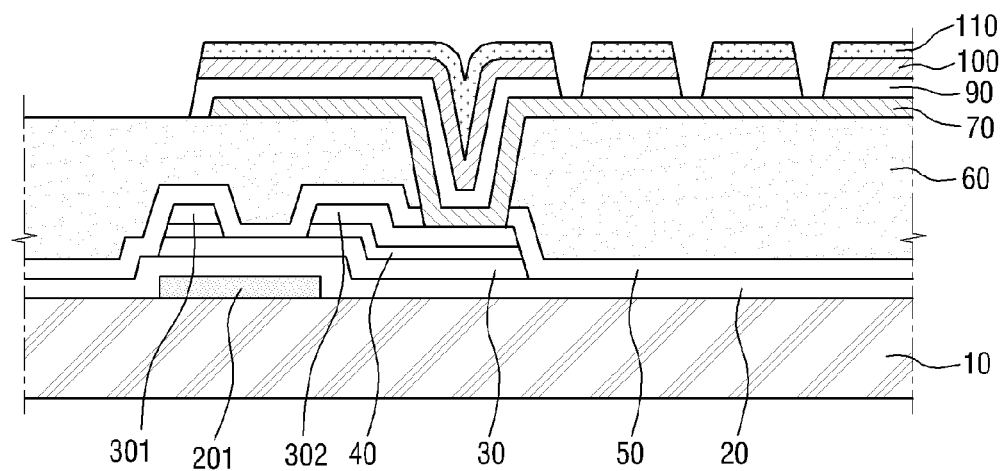

In an exemplary embodiment, the third cutout patterns 91 may be provided in the passivation layer 90 by etching the passivation layer 90 using the first cover layer 110 as an etch mask. The providing of the third cutout patterns 91 in the passivation layer 90 by etching the passivation layer 90 using the first cover layer 110 as an etch mask will now be described in detail with reference to FIG. 14. Referring to FIG. 14, the passivation layer 90 may be at least partially etched using the first cover layer 110 as an etch mask. In such an embodiment, at least a portion of the passivation layer 90 may be etched using the first cover layer 110 as an etch mask and the organic layer 60 and the first electrode 90 as etch-stop layers. In an exemplary embodiment, the second photosensitive layer patterns 82 on the first cover layer 110 may be removed before the etching of the passivation layer 90 using the first cover layer 110 as an etch mask or after the etching of the passivation layer 90 using the first cover layer 110 as an etch mask. This will be described later in greater detail. In an exemplary embodiment, the passivation layer 90 may be dry-etched, for example, but the etching of the passivation layer 90 is not limited to dry etching. In such an embodiment, a fluorine (F)-based etching gas may be used as an etching gas, for example, but the type of etching gas is not limited to the fluorine-based etching gas.

The patterns in the passivation layer 90 formed by the partial etching of the passivation layer 90 may correspond to the shape of the first cutout patterns 111 of the first cover layer 110. In such an embodiment, a plurality of cutout patterns may be provided in the passivation layer 90. For convenience of description, cutout patterns provided in the passivation layer 90 will be referred to as the third cutout patterns 91. The third cutout patterns 91 may be at least partially overlapped by the first cutout patterns 111 or the second cutout patterns 101.

In such an embodiment, where the passivation layer 90 is etched using the first cover layer 110 as an etch mask, etch selectivity is relatively improved as compared with a conventional method where the passivation layer 90 is etched using only the second photosensitive layer patterns 82 and without the first cover layer 110. When the passivation layer 90 is etched using only the second photosensitive layer patterns 82 and without the first cover layer 110, the passivation layer 90 under the second electrode 100 may be over-etched, causing a portion of the second electrode 100 to protrude further than the passivation layer 90 such that coverage of an alignment layer provided on the second electrode 100 may be adversely affected. In an exemplary embodiment, where the passivation layer 90 is etched using the first cover layer 110 disposed on the second electrode 100 as an etch mask, the etch selectivity is substantially improved as described above, and anisotropic etching may be effectively and efficiently performed. In such an embodiment, the passivation layer 90 may be effectively prevented from being over-etched and thus causing a portion of the second electrode 100 to protrude further than the passivation layer 90.

In an exemplary embodiment, the method of manufacturing a TFT array substrate may further include removing the second photosensitive layer patterns 82 disposed on the first cover layer 110 after the etching of the passivation layer 90 using the first cover layer 110 as an etch mask. The removing of the second photosensitive layer patterns 82 disposed on the first cover layer 110 will now be described in detail with reference to FIG. 15. As shown in FIG. 5, the second photosensitive layer patterns 82 disposed on the first cover layer 110 is removed, such that the first electrode 70 may be disposed on the organic layer 60, the passivation layer 90 having the third cutout patterns 91 which partially expose the first electrode 70 may be disposed on the first electrode 70, the second electrode 100 having the second cutout patterns 101 which at least partially overlap the third cutout patterns 91 may be disposed on the passivation layer 90, and the first cover layer 110 having the first cutout patterns 111 which at least partially overlap the second cutout patterns 101 may be disposed on the second electrode 100.

An exemplary embodiment of the method of manufacturing a TFT array substrate may further include removing the first cover layer 110 after the providing of the third cutout patterns 91 in the passivation layer 90. The removing of the first cover layer 110 will now be described in detail with reference to FIGS. 16 and 17.

The removing of the first cover layer 110 may include crystallizing the second electrode 100 by annealing the second electrode 100 on the first substrate 10 and etching the first cover layer 110.

In such an embodiment, the first substrate 10 may be annealed. The annealing of the second electrode 100 on the first substrate 10 may crystallize ITO or IZO in the second electrode 100. In an exemplary embodiment, the annealing process may be performed at a temperature of about 220° C. or above, for example, but not being limited thereto.

Then, the first cover layer 110 may be etched. The crystallization of the second electrode 100 may change etching characteristics of the second electrode 100. In the etching of the first cover layer 110 and the second electrode 100 using the second photosensitive layer patterns 82 as an etch mask, the first cover layer 110 and the second electrode 100 may be etched by the same etchant. However, the crystallization of the second electrode 100 by the annealing process changes the etching characteristics of the second electrode 100. Therefore, when an etching process is performed using an etchant, the second electrode 100 may be left unchanged, and only the first cover layer 110 may be etched. Accordingly, the first cover layer 110 disposed on the second electrode 100 may be removed.

Figure 16:
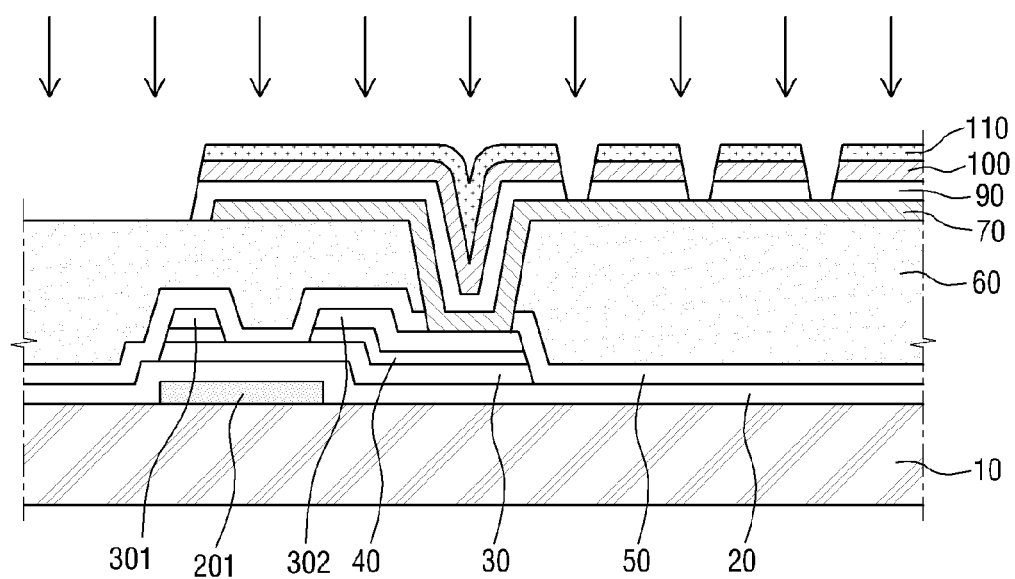
Figure 17:
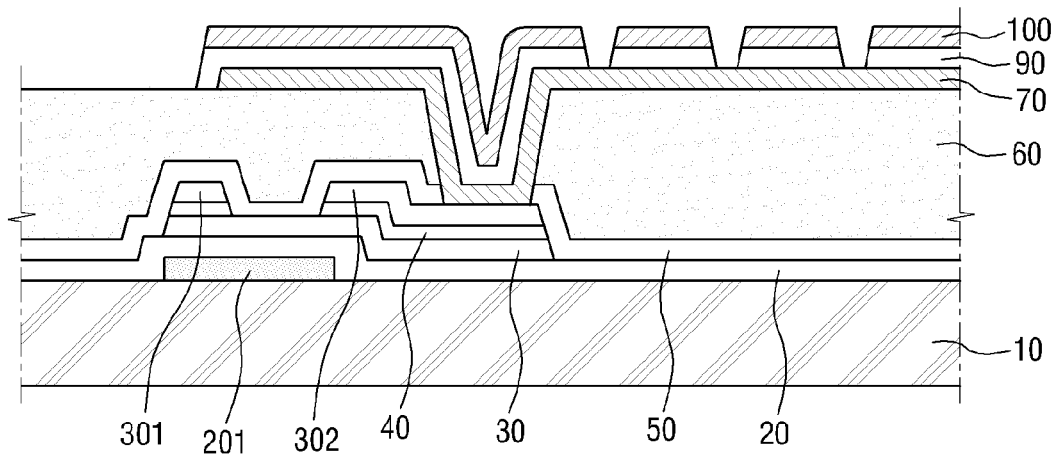

In FIGS. 16 and 17, the first cover layer 110 may be removed by etching, for example, but the invention is not limited by a specific method of removing the first cover layer 110. In an alternative exemplary embodiment, the first cover layer 110 may be removed using various types of physical and chemical methods.

An exemplary embodiment of the method of manufacturing a TFT array substrate may further include providing a common electrode pad in a non-display area located around the display area in which the first electrode 70 is provided. The providing of the common electrode pad in the non-display area located around the display area in which the first electrode 70 is provided will now be described in detail with reference to FIGS. 18 through 27.

Figure 18:
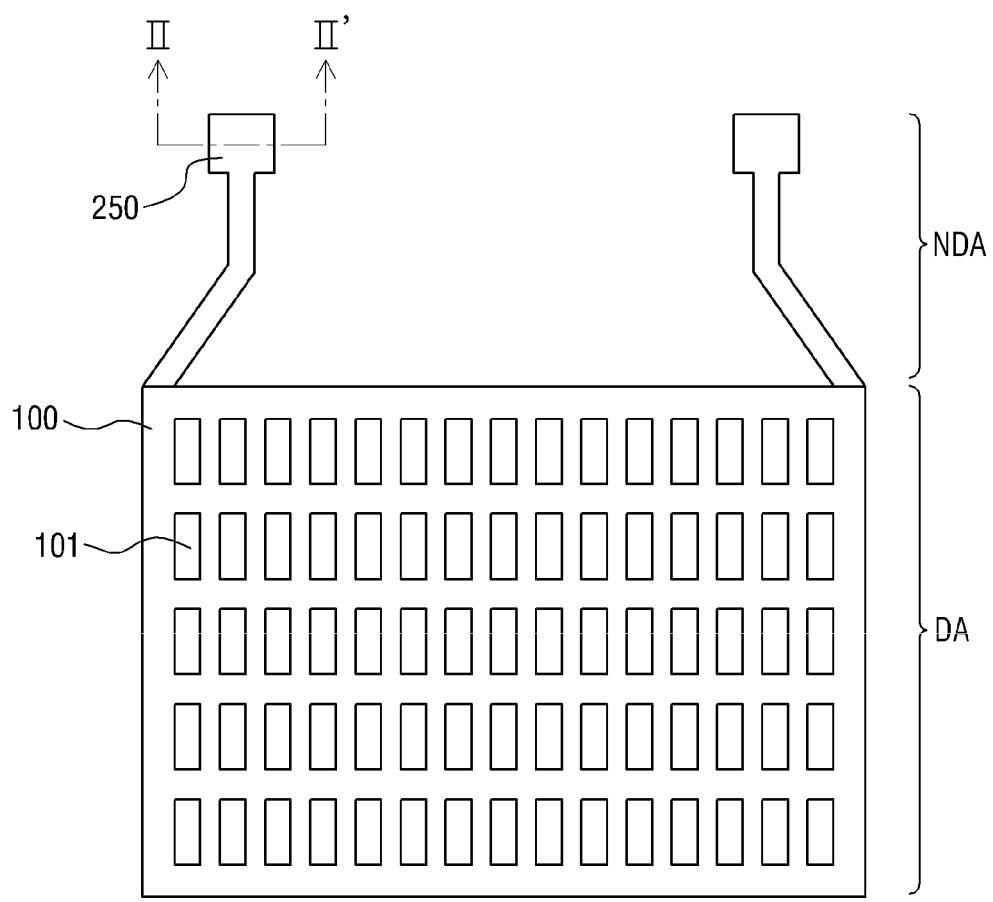
FIG. 18 is a partial plan view of a TFT array substrate manufactured by an exemplary embodiment of the method of manufacturing a TFT array substrate according to the invention.

FIG. 18 is a partial plan view of a TFT array substrate manufactured by an exemplary embodiment of the method of manufacturing a TFT array substrate, according to the invention.

Figure 19:
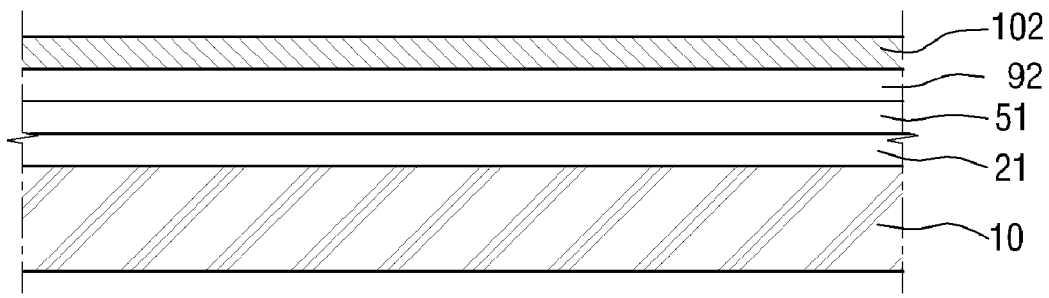
FIG. 19 is a cross-sectional view taken along line II-II' of FIG. 18.

FIG. 19 is a cross-sectional view taken along line II-II' of FIG. 18.

FIGS. 20 through 27 are cross-sectional views illustrating an exemplary embodiment of the method of manufacturing a TFT array substrate, according to the invention.

Referring to FIGS. 18 through 26, the providing of the common electrode pad 250 in the non-display area located around the display area in which the first electrode 70 is provided includes preparing a substrate including one or more buffer layers and an electrode layer 102 which is disposed on the buffer layers, providing a second cover layer 112 on the electrode layer 102, providing a photosensitive layer pattern 83 on the second cover layer 112 to cover at least a portion of the second cover layer 112, etching the second cover layer 112 and the electrode layer 102 using the photosensitive layer pattern 83 as an etch mask, etching a topmost buffer layer among the buffer layers by using the second cover layer 112 as an etch mask, removing the photosensitive layer pattern 83, and removing the second cover layer 112.

In an exemplary embodiment, the TFT array substrate may include a display area DA in which a plurality of pixels are provided and a non-display area NDA which is located around the display area DA. In the non-display area NDA, pads (such as a data pad (not shown), a gate pad (not shown) and the common electrode pad 250), a driver (not shown) which applies a driving voltage to each electrode, and a connection wiring (not shown) which is connected to each electrode may be provided.

In such an embodiment, the common electrode pad 250 may be electrically connected to the second electrode 100 and may extend from an end of the second electrode 100. The common electrode pad 250 may be connected to a common voltage applying unit (not shown) which applies a common voltage to the second electrode 100. The providing of the common electrode pad 250 in the non-display area NDA will now be described in detail.

To provide the common electrode pad 250, one or more buffer layers and the electrode layer 102 which covers the buffer layers are provided on the first substrate 10. In FIGS. 19 through 26, three buffer layers (21, 51, 92) are provided on the first substrate 10.

First, a first buffer layer 21 may be provided on the first substrate 10. The first buffer layer 21 may include substantially the same material as the gate insulating layer 20 of the display area DA. The first buffer layer 21 may be provided at the same time as when the gate insulating layer 20 is provided in the display area DA, but the invention is not limited thereto.

A second buffer layer 51 may be provided on the first buffer layer 21. The second buffer layer 51 may include substantially the same material as the protective layer 50 of the display area DA. The second buffer layer 51 may be provided at the same time as when the protective layer 50 is provided in the display area DA, but the invention is not limited thereto.

A third buffer layer 92 may be provided on the second buffer layer 51. The third buffer layer 92 may include substantially the same material as the passivation layer 90 of the display area DA. The third buffer layer 92 may be provided at the same time as when the passivation layer 90 is provided in the display area DA, but the invention is not limited thereto.

An electrode layer 102 may be provided on the third buffer layer 92. The electrode layer 102 may be formed of substantially the same material as the second electrode 100. The electrode layer 102 may be provided at the same time as when the second electrode 100 is provided in the display area DA, but the invention is not limited thereto.

Figure 20:
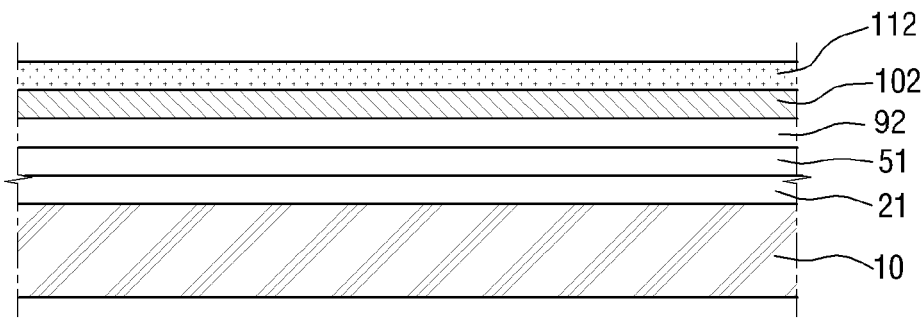
FIGS. 20 through 26 are cross-sectional views illustrating an exemplary embodiment of a method of manufacturing a TFT array substrate, according to the invention.
Figure 21:
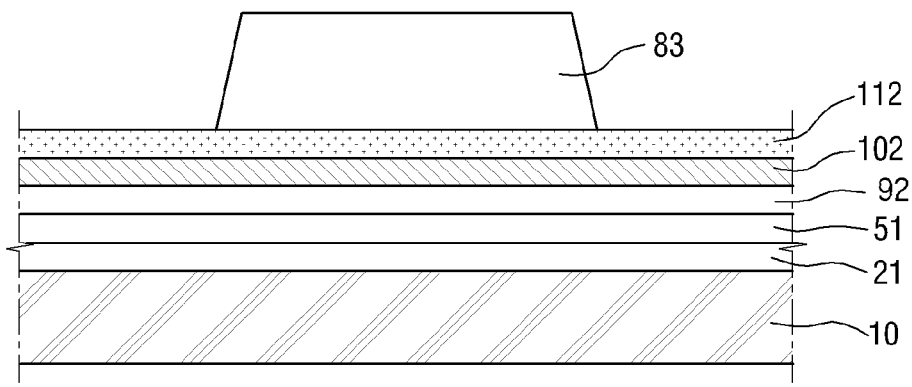
Figure 22:
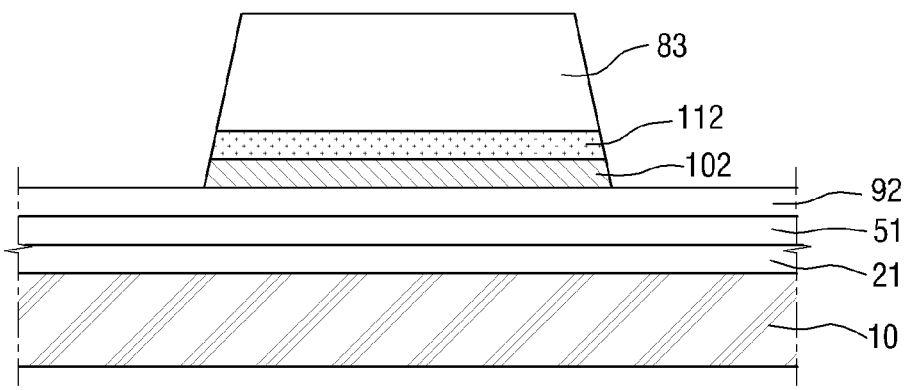

In FIG. 20, three buffer layers (21, 51, 92) are provided on the first substrate 10. However, the scope of the invention is not limited thereto. That is, at least some of the three buffer layers (21, 51, 92) can be omitted, and an intermediate layer can be interposed between the buffer layers (21, 51, 92).

The second cover layer 112 is provided on the electrode layer 102. The providing of the second cover layer 112 on the electrode layer 102 will now be described with reference to FIG. 20. The second cover layer 112 may be provided to completely cover the electrode layer 102, but the invention is not limited thereto. The second cover layer 112 in the non-display area NDA may be substantially the same as the first cover layer 110 in the display area DA. In one exemplary embodiment, for example, when the first cover layer 110 is provided in the display area DA, the first cover layer 110 may also be provided to extend to the non-display area NDA. In such an embodiment, the first cover layer 110 and the second cover layer 112 are substantially the same as each other and may be integrally formed as a single and indivisible unit. In such an embodiment, the first cover layer 110 may be provided in the display area DA at the same time as when the second cover layer 112 is provided in the non-display area NDA.

The third photosensitive layer pattern 83 is provided on the second cover layer 112. The providing of the third photosensitive layer pattern 83 on the second cover layer 112 will now be described with reference to FIG. 21. The third photosensitive layer pattern 83 may be provided on the second cover layer 112 and may cover at least a portion of the second cover layer 112.

The second cover layer 112 and the electrode layer 102 are etched using the third photosensitive layer pattern 83 as an etch mask. The etching of the second cover layer 112 and the electrode layer 102 using the third photosensitive layer pattern 83 as an etch mask will now be described with reference to FIG. 22. The second cover layer 112 and the electrode layer 102 may be at least partially etched using the third photosensitive layer pattern 83 as an etch mask. In such an embodiment, the second cover layer 112 and the electrode layer 102 may be etched using the third photosensitive layer pattern 83 as an etch mask and the third buffer layer 92 as an etch-stop layer. In an exemplary embodiment, the second cover layer 112 and the electrode layer 102 may be wet-etched. In an exemplary embodiment, the second cover layer 112 and the second electrode 102 may be etched together. In such an embodiment, an etchant including phosphoric acid, nitric acid, acetic acid, or a combination thereof may be used to etch the second cover layer 112 and the electrode layer 102. In such an embodiment, the second cover layer 112 and the electrode layer 102 may be etched together using the same etchant, depending on the materials that form the second cover layer 112 and the electrode layer 102. In one exemplary embodiment, for example, where the second cover layer 112 includes an aluminum-based material and the electrode layer 102 includes ITO, a Mo/Al/Mo etchant may be used to etch the second cover layer 112 and the electrode layer 102 together. However, the materials of the second cover layer 112 and the electrode layer 102 and the type of etchant are not limited thereto. In an alternative exemplary embodiment, the second cover layer 112 and the electrode layer 102 may be etched separately or independently of each other.

Figure 23:
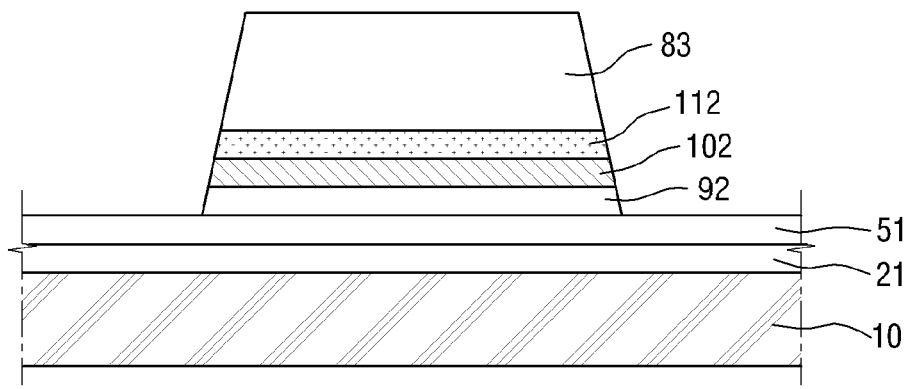

A buffer layer disposed under the electrode layer 102 is etched using the second cover layer 112 as an etch mask. The etching of the topmost buffer layer using the second cover layer 112 as an etch mask will now be described with reference to FIG. 23. Referring to FIG. 23, at least a portion of the third buffer layer 92 may be etched using the second cover layer 112 as an etch mask.

In such an embodiment, the third photosensitive layer pattern 83 on the second cover layer 112 may be removed before the etching of the third buffer layer 92 using the second cover layer 112 as an etch mask or after the etching of the third buffer layer 92 using the second cover layer 112 as an etch mask. This will be described later in greater detail.

In an exemplary embodiment, the third buffer layer 92 may be dry-etched, but the invention is not limited thereto. In an exemplary embodiment, a fluorine (F)-based etching gas may be used as an etching gas, but the type of etching gas is not limited to the fluorine-based etching gas.

Figure 24:
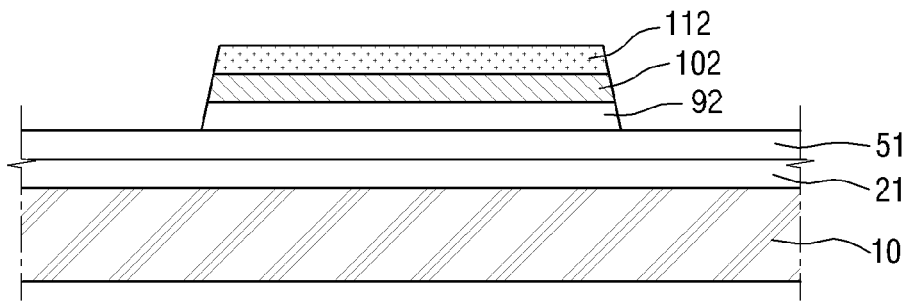

In an exemplary embodiment, the third photosensitive layer pattern 83 is removed. The removing of the third photosensitive layer pattern 83 will now be described with reference to FIG. 24. Referring to FIG. 24, the removing of the third photosensitive layer pattern 83 disposed on the second cover layer 112 may expose the second cover layer 112. In an exemplary embodiment, as shown in FIG. 24, the removing of the third photosensitive layer pattern 83 is performed after the etching of the third buffer layer 92 using the second cover layer 112 as an etch mask, but not being limited thereto. In an alternative exemplary embodiment, the removing of the third photosensitive layer pattern 83 may be performed before the etching of the third buffer layer 92 using the second cover layer 112 as an etch mask.

In such an embodiment, the second cover layer 112 is removed. The removing of the second cover layer 112 will now be described with reference to FIGS. 25 and 26.

The removing of the second cover layer 112 may include crystallizing the electrode layer 102 by annealing the second electrode layer 102 on the first substrate 10 and etching the second cover layer 112.

In such an embodiment, the first substrate 10 may be annealed. The annealing the second electrode layer 102 on of the first substrate 10 may crystallize ITO or IZO in the electrode layer 102. In an exemplary embodiment, the annealing process may be performed at a temperature of about 220° C. or above, for example, but not being limited thereto.

Then, the second cover layer 112 may be etched. The crystallization of the electrode layer 102 may change etching characteristics of the electrode layer 102. In the etching of the second cover layer 112 and the electrode layer 102 using the third photosensitive layer pattern 83 as an etch mask, the second cover layer 112 and the electrode layer 102 may be etched by the same etchant. However, the crystallization of the electrode layer 102 by the annealing process changes the etching characteristics of the electrode layer 102. Therefore, when an etching process is performed, the electrode layer 102 may be left unchanged, and only the second cover layer 112 may be etched. Accordingly, only the second cover layer 112 disposed on the electrode layer 102 may be removed in such an embodiment.

Figure 25:
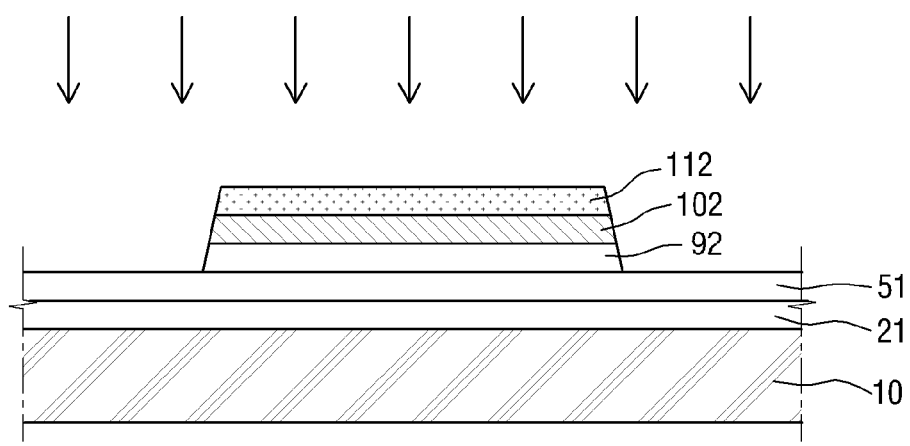
Figure 26:
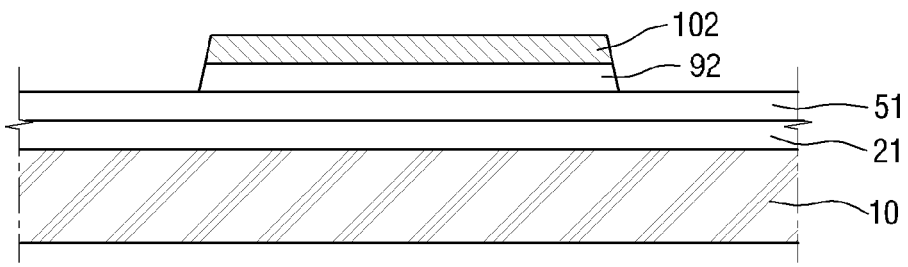

In FIGS. 25 and 26, the second cover layer 112 may be removed by etching, but the invention is not limited by a specific method of removing the second cover layer 112. In an alternative exemplary embodiment, the second cover layer 112 may be removed using various types of physical and chemical methods.

The etching of the second cover layer 112 may expose the electrode layer 102, thereby completing the providing of the common electrode pad 250.

Figure 27:
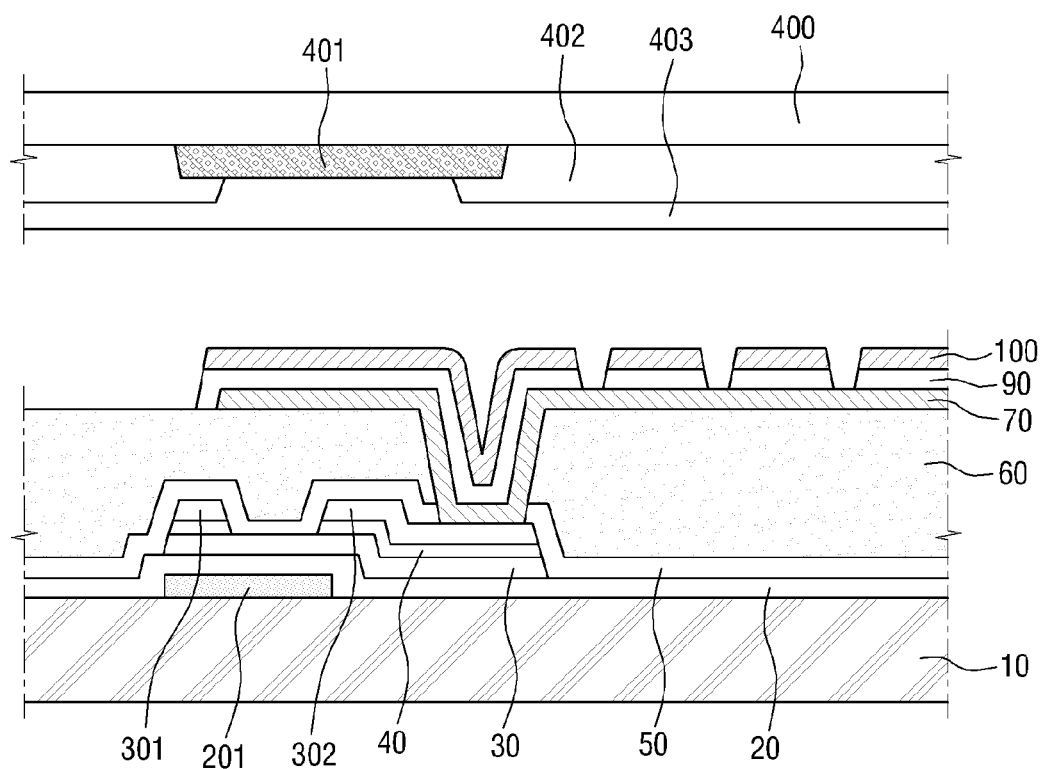
FIG. 27 is a cross-sectional view illustrating an exemplary embodiment of a method of manufacturing a liquid crystal display ("LCD"), according to the invention.

FIG. 27 is a cross-sectional view illustrating an exemplary embodiment of a method of manufacturing a liquid crystal display ("LCD"), according to the invention.

Referring to FIG. 27, the method of manufacturing an LCD includes providing a plurality of gate lines 200 and a plurality of data lines 300 on a first substrate 10, providing an organic layer 60 on the gate lines 200 and the data lines 300, providing a first electrode 70 on the organic layer 60 to cover at least part of the organic layer 60, providing a passivation layer 90 on the first electrode 70, providing a second electrode 100 on the passivation layer 90, providing a cover layer 110 on the second electrode 100 to cover the second electrode 100, providing photosensitive layer patterns on the cover layer 110, providing first cutout patterns 111 in the cover layer 110 and second cutout patterns 101 in the second electrode 100 by etching the cover layer 110 and the second electrode 100 using the photosensitive layer patterns as an etch mask, removing the photosensitive layer patterns, removing the cover layer 110, and providing a second substrate 400 to face the first substrate 10.

The providing of the gate lines 200 and the data lines 300 on the first substrate 10, the providing of the organic layer 60 on the gate lines 200 and the data lines 300, the providing of the first electrode 70 on the organic layer 60 to cover at least part of the organic layer 60, the providing of the passivation layer 90 on the first electrode 70, the providing of the second electrode 100 on the passivation layer 90, the providing of the cover layer 110 on the second electrode 100 to cover the second electrode 100, the providing of the photosensitive layer patterns on the cover layer 110, the providing of the first cutout patterns 111 in the cover layer and second cutout patterns 101 in the second electrode 100 by etching the cover layer 110 and the second electrode 100 using the photosensitive layer patterns as an etch mask, the removing of the photosensitive layer patterns, and the removing of the cover layer 110 in such an embodiment of the method of manufacturing an LCD are substantially the same as those in the exemplary embodiments of the method of manufacturing a TFT array substrate described with reference to FIGS. 1 to 17, and thus any repetitive detailed description thereof will be omitted.

In an exemplary embodiment, the method of manufacturing the LCD may further include providing a common electrode pad in a non-display area NDA located around a display area DA in which the first electrode 70 is provided. The providing of the common electrode pad in the non-display area NDA is substantially the same as that in the exemplary embodiments of the method of manufacturing a TFT array substrate described with reference to FIGS. 18 to 26, and thus any repetitive detailed description thereof will be omitted.

The second substrate 400 may be provided, e.g., disposed, above the first substrate 10 to face the first substrate 10. The second substrate 400 may be an insulating substrate including a transparent material, such as glass or plastic, for example. A light-blocking member 41 may be provided on the second substrate 400. The light-blocking member 401 may also be referred to as a black matrix and may effectively prevent the leakage of light from a display device.

In such an embodiment, a plurality of color filters 402 may be provided on the second substrate 400. An overcoat layer 403 may be provided on the color filters 402 and the light-blocking member 401. The overcoat layer 403 may include an organic insulating material. The overcoat layer 403 may effectively prevent the exposure of the color filters 402 and provide a flat surface. In an alternative exemplary embodiment, the overcoat layer 403 may be omitted. Although not shown in the drawing, an alignment layer may be provided on a cover layer 110.

A liquid crystal layer (not shown) may be interposed between the first substrate 10 and the second substrate 400. The liquid crystal layer may include a nematic liquid crystal material having positive dielectric anisotropy. Liquid crystal molecules of the liquid crystal layer may have a longitudinal axis aligned substantially parallel to the first substrate 10 and the second substrate 400.

According to exemplary embodiments of the invention as described herein, two electric field generating electrodes may be provided on one TFT array substrate without increasing manufacturing costs, and a passivation layer disposed under an electrode may be effectively prevented from being over-etched and thus causing a portion of the electrode to protrude further than the passivation layer.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A method of manufacturing a thin-film transistor array substrate, the method comprising:
    providing a plurality of gate lines and a plurality of data lines on a first substrate;
    providing an organic layer on the gate lines and the data lines;
    providing a first electrode on the organic layer;
    providing a passivation layer on the first electrode;
    providing a second electrode on the passivation layer;
    providing a first cover layer on the second electrode to cover the second electrode;
    providing a plurality of first photosensitive layer patterns on the first cover layer;
    providing a plurality of first cutout patterns in the first cover layer and a plurality of second cutout patterns in the second electrode using the first photosensitive layer patterns as an etch mask; and
    providing a plurality of third cutout patterns in the passivation layer using the first cover layer as an etch mask.

2. The method of claim 1, further comprising:
    removing the first photosensitive layer patterns after the providing of the first cutout patterns in the first cover layer and the second cutout patterns in the second electrode using the first photosensitive layer patterns as the etch mask.

3. The method of claim 1, further comprising:
    removing the first photosensitive layer patterns after the providing of the third cutout patterns in the passivation layer using the first cover layer as the etch mask.

4. The method of claim 3, further comprising:
    removing the first cover layer.

5. The method of claim 4, wherein the removing of the first cover layer comprises crystallizing the second electrode by annealing the second electrode on the first substrate.

6. The method of claim 1, wherein the first cover layer comprises a metal.

7. The method of claim 6, wherein the first cover layer comprises aluminum or an aluminum alloy.

8. The method of claim 1, further comprising:
    providing a common electrode pad in a non-display area located around a display area in which the first electrode is provided.

9. The method of claim 8, wherein the providing of the common electrode pad in the non-display area located around the display area in which the first electrode is provided comprises:
    providing one or more buffer layers and an electrode layer, which covers the buffer layers, on the first substrate;
    providing a second cover layer on the electrode layer;
    providing a second photosensitive layer pattern on the second cover layer to cover at least a portion of the second cover layer;
    etching the second cover layer and the electrode layer using the second photosensitive layer pattern as an etch mask;
    etching a topmost buffer layer among the buffer layers using the second cover layer as an etch mask;
    removing the second photosensitive layer pattern; and
    removing the second cover layer.

10. The method of claim 9, wherein
    the providing of the second electrode and the providing of the electrode layer are performed simultaneously to each other, and
    the providing of the first cover layer to cover the second electrode and the providing of the second cover layer to cover the electrode layer are performed simultaneously to each other.

11. The method of claim 9, wherein the removing of the second cover layer comprises crystallizing the electrode layer by annealing the second electrode on the first substrate.

12. A method of manufacturing a liquid crystal display, the method comprising:
    providing a plurality of gate lines and a plurality of data lines on a first substrate;
    providing an organic layer on the gate lines and the data lines;
    providing a first electrode on the organic layer;
    providing a passivation layer on the first electrode;
    providing a second electrode on the passivation layer;
    providing a first cover layer on the second electrode to cover the second electrode;
    providing a plurality of first photosensitive layer patterns on the first cover layer;
    providing a plurality of first cutout patterns in the first cover layer and a plurality of second cutout patterns in the second electrode by etching the first cover layer and the second electrode using the first photosensitive layer patterns as an etch mask;
    removing the first photosensitive layer patterns;
    removing the first cover layer; and
    providing a second substrate to face the first substrate.

13. The method of claim 12, further comprising:
    providing a common electrode pad in a non-display area located around a display area in which the first electrode is provided.

14. The method of claim 13, wherein the providing of the common electrode pad in the non-display area located around the display area in which the first electrode is provided comprises:
    providing one or more buffer layers and an electrode layer, which covers the buffer layers, on the first substrate;
    providing a second cover layer on the electrode layer;
    providing a second photosensitive layer pattern on the second cover layer to cover at least a portion of the second cover layer;
    etching the second cover layer and the electrode layer using the second photosensitive layer pattern as an etch mask;
    etching a topmost buffer layer among the buffer layers using the second cover layer as an etch mask;
    removing the second photosensitive layer pattern; and
    removing the second cover layer.

15. The method of claim 14, wherein
    the providing of the second electrode and the providing of the electrode layer are performed simultaneously to each other, and
    the providing of the first cover layer to cover the second electrode and the providing of the second cover layer to cover the electrode layer are performed simultaneously to each other.

16. The method of claim 15, further comprising:
    crystallizing the second electrode and the electrode layer by annealing the second electrode on the first substrate.

17. The method of claim 14, wherein each of the first cover layer and the second cover layer comprises a metal.

18. The method of claim 17, wherein each of the first cover layer and the second cover layer comprises aluminum or an aluminum alloy.

19. The method of claim 12, wherein the second substrate comprises a light-blocking member and color filters disposed thereon.

20. The method of claim 19, wherein the second substrate further comprises an overcoat layer which covers the light-blocking member.

\* \* \* \* \*